(12) United States Patent
Pasternack et al.

(10) Patent No.: US 6,280,851 B1
(45) Date of Patent: Aug. 28, 2001

(54) MULTILAYER PRODUCT FOR PRINTED CIRCUIT BOARDS

(75) Inventors: Melvin Pasternack, Marlboro, NJ (US); Jurgen Matthes, Hinsdale, IL (US)

(73) Assignee: Sentrex Company, Inc., Morganville, NJ (US)

( * ) Notice: Subject to any disclaimer, the term of this patent is extended or adjusted under 35 U.S.C. 154(b) by 0 days.

(21) Appl. No.: 09/046,327

(22) Filed: Mar. 23, 1998

(51) Int. Cl.[7] .................................................. B32B 15/08
(52) U.S. Cl. .......................... 428/447; 428/418; 428/448; 428/450; 361/750; 361/762
(58) Field of Search ..................................... 428/447, 448, 428/450, 418; 361/750, 762

(56) References Cited

U.S. PATENT DOCUMENTS

| | | | |
|---|---|---|---|
| 4,818,576 | * | 4/1989 | Pennace et al. .......................... 428/40 |
| 5,091,251 | * | 2/1992 | Sakumoto et al. ..................... 428/352 |
| 5,120,590 | * | 6/1992 | Savage et al. ........................... 428/76 |
| 5,309,925 | * | 5/1994 | Policastro ............................. 128/849 |
| 5,350,621 | * | 9/1994 | Yuhas et al. .......................... 428/209 |
| 5,413,838 | * | 5/1995 | Azuma et al. ........................ 428/194 |
| 5,562,917 | * | 10/1996 | Durif et al. ........................... 424/447 |

* cited by examiner

Primary Examiner—Margaret G. Moore
(74) Attorney, Agent, or Firm—Bruce F. Jacobs

(57) ABSTRACT

Copper foil used in printed circuit boards is protected from contamination both prior to laying up the circuit board components and during processing by a multilayer protective film structure having a silicone adhesive disposed on one entire surface and a silicone release composition on the other entire surface.

19 Claims, 1 Drawing Sheet

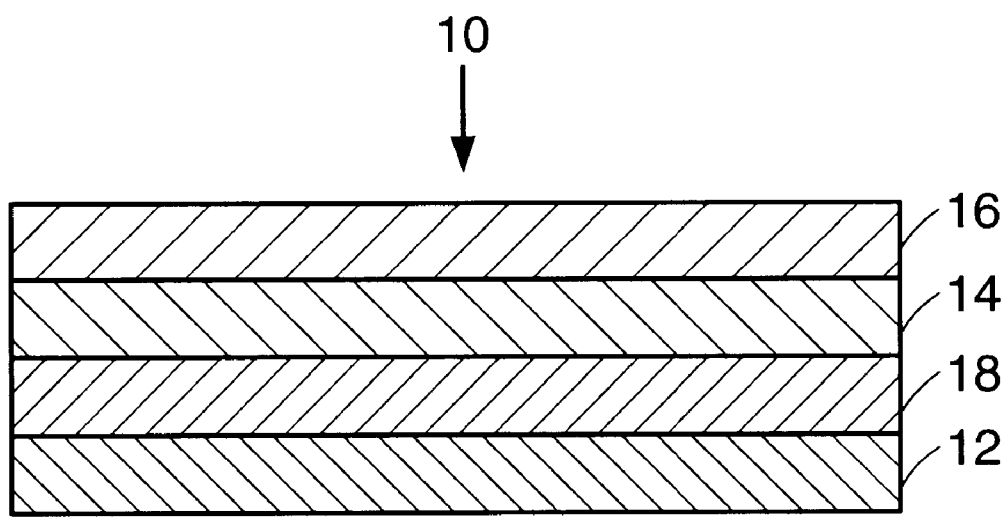

MULTILAYER PRODUCT FOR PRINTED CIRCUIT BOARDS

FIELD OF THE INVENTION

The present invention relates to printed circuit boards in general and more specifically to a multilayer product useful for the protection of components employed in the manufacturing of printed circuit boards.

BACKGROUND OF THE INVENTION

In its elementary form, a printed circuit board includes, as a component, a dielectric layer of an epoxy resin-impregnated woven glass fiber body which is known as a "pre-preg." On one or both sides of the prepreg is bonded a conductive copper foil sheet. Subsequently, much of the copper, through a number of processes, including photographic, is etched away to leave conductive paths on the surface of the prepreg layer. When so assembled, the lamination is often called a core or a board. It is not uncommon to assemble a stack of such boards. The assembly is called a press lay-up and the stack is called a book. An entire press lay-up is heated and subjected to pressure. Upon curing and cooling, the then bonded individual boards are separated from each other and subjected to further processing in well known manners.

Of utmost importance in the manufacturing process is the maintenance of cleanliness or lack of contamination of the copper foil sheets. This is true whether or not the printed ciruit board has one copper layer on one side of a prepreg or is a compound board of numerous layers. A clean environment is one way to avoid, or at least minimize, contamination problems from resin dust, fiberglass fibers, hairs, bugs, and the like, which could cause defects in the copper circuit of the finished printed circuit board.

Another way is to use a protective film as disclosed in U.S. Pat. No. 5,120,590 in which the marginal edges of the protective film are removably joined to a copper foil layer. During use, the entire marginal edge area is cut off and thrown away, creating a substantial waste problem. Alternatively, if the protective film and copper foil are only joined at an end, there is substantial problem with maintaining alignment between the two, resulting in a contaminated copper foil.

Alternatively, U.S. Pat. No. 5,153,050 discloses the use of an aluminum sheet adhered along its marginal edges to two copper foil layers. This system is for use between two epoxy resin-impregnated woven glass fiber bodies. The aluminum sheet is generally thrown away leading to increased waste disposal. There have been substantial problems with panel alignment both before and during pressing as well as image transfer problems.

Other attempts at solving the same problems, while avoiding some of the drawbacks of the above systems, have failed to be commercially viable, apparently due to inoperativeness. For example, U.S. Pat. No. 5,057,372 discloses the use of various polyolefin based adhesives to coat the entire surface of the protective film layer. PCT/US95/08436 (WO96/01605) and PCT/IB96/01151 (WO97/15446) disclose the use of electron-beam curable adhesives particularly saturated copolyesters with terminal acrylic double bonds.

Accordingly, there remains a need for a system which will provide improved protection to minimize contamination problems of copper foils in the printed circuit board industry while simultaneously overcoming the problems noted above.

SUMMARY OF THE INVENTION

The present invention relates to a protected copper foil laminate comprising (A) a copper foil layer, and (B) a multilayer protective film having an outer surface coated with a silicone polymer release composition which prevents adhesion of the film at high temperature and pressure laminating conditions, and an inner surface adjacent the copper foil layer, said inner surface having disposed uniformly thereon a solution of a pressure sensitive silicone polymer in an organic solvent from which the organic solvent is removed, wherein after exposure of the copper foil laminate to a temperature of at least 300° F. and a pressure of at least 300 psi, none of the pressure sensitive silicone polymer transfers to the copper foil layer.

This invention further relates to a method of protecting a copper foil intended for use in the manufacture of printed circuit boards, by providing a release coating on one side of a polyester film; applying a solution of a pressure sensitive silicone adhesive in an organic solvent to the other side of the polyester film; removing the organic solvent; and laminating a copper foil to the pressure sentitive silicone adhesive side of the polyester film.

Still further, this invention relates to a protected copper foil laminate of a clean copper foil sheet and a protective deep matte polyester film laminated to said copper foil sheet, said film having a smooth side and a rough side and having a uniform layer of a release coating on the entire smooth side and a uniform layer of a pressure sensitive silicone adhesive on the entire rough side, the silicone adhesive being in adhesive contact with the copper foil sheet, wherein no adhesive transfers to the copper foil sheet after exposure of the laminate to a temperature of at least 300° F. and a pressure of at least 300 psi.

BRIEF DESCRIPTION OF THE DRAWINGS

FIG. 1 is a fragmentary cross section of an embodiment of the present invention.

DESCRIPTION OF THE PREFERRED EMBODIMENTS

Now referring to FIG. 1, FIG. 1 illustrates an embodiment of the present invention and shows a cross-section of a multilayer film product of the invention generally indicated as 10. While the preferred embodiment is described in terms of a copper foil laminate used in making printed circuit boards, it will be appreciated by those skilled in the art that, broadly speaking, this invention is applicable to copper foil laminates for other uses in which similar use requirements are present.

In accordance with the product of FIG. 1, a copper foil 12 is present. Generally, a 0.25 to 2 ounce/square foot copper foil is used. Preferably, a 0.5 or a 1.0 ounce copper foil is used.

Located atop the copper foil to protect the shiny side thereof is a protective film 14. Any suitable protective polymer film can be used and such are well known in the art. Preferably a polyester film is used. Suitable polyester films generally are about 1 mil thick and have a deep matte. More particularly they exhibit tensile strengths in both the machine direction and the transverse direction of more than 10,000 psi, preferably more than 15,000 psi. In addition the polyester film has a melting point above 450° F. and a glass transition temperature of above 140° F. Preferably, the film is highly delustered by having incorporated therein one or more inert materials such as calcium carbonate, fumed silica, or the like. Most preferably the amount of inorganic material is sufficient to cause the film to be "deep matte."

The polyester film 14 carries a conventional release coating 16 on its smooth side. Suitable such coatings are well known in the industry and are generally based upon acrylic or silicone technology. Preferably a silicone release coating is used. Prior to heat curing, a silicone release coating generally comprises a silicone monomer and a metal polymerization catalyst dispersed within a suitable solvent system. Suitable such catalysts include both base metals, e.g. tin, in the form of organometallic compounds or precious metals, e.g. palladium, platinum, and rhodium. Alternatively, the composition may contain an ultraviolet light initiator. Examples of suitable commercially available release coatings include those marketed as one of the 164, 4,000, 6,000, and 7,000 series of products from DCP Inc., Willowbrook, Ill.

The release coating 16 may be deposited on the protective film 14 by any conventional coating means known to the art. Most commonly, Mayer rod coating, gravure coating and five roll coating is used. Generally the release coating 14 is used in an amount of about 0.2 to 5, preferably about 0.3 to 1, lbs per ream dry (wherein one ream is 3,000 ft$^2$).

On the other (rough) side, the polyester film 14 carries a heat-activated, pressure sensitive silicone adhesive 18. The adhesive must exhibit multiple characteristics. Particularly, the adhesive must adhere to the polyester film and to the copper foil at room temperature. as well as under press conditions. It also must provide easy release and be 100% removable from the copper foil after exposure to temperatures as high as 390° F. and pressures as high as 400 psi for time periods of from about 60 to 120 minutes. The adhesive also must not block, i.e. transfer any low molecular weight adhesive materials to the copper foil. Preferably, there is no deleterious interaction between the adhesive layer 18 and the release coating 16 during storage, i.e. prior to the structure being joined to the copper foil. If there is an interaction, the copper foil layer can be joined to the adhesive layer immediately, i.e. without rolling up the double coated polyester film. Alternatively, a simple paper or other barrier layer (not shown) can be placed on one of the surfaces during roll up to prevent direct contact between the adhesive and the release coating.

The pressure sensitive siloxane adhesives are based upon a condensation reaction of a siloxane gum and a siloxane resin and are identified based upon the basic repeating element. Suitable pressure sensitive silicone adhesives are known in the art. They include polysiloxanes, polyalkylsiloxanes [also sometimes referred to as alkylpolysiloxanes] wherein the alkyl group contains 1 to 4 carbon atoms, polydialkylsiloxanes [dialkylpolysiloxanes] wherein the alkyl groups are the same or different and contain 1 to 4 carbon atoms, polyaryl-substituted-dialkylsiloxanes, halosiloxanes, polydiarylsiloxanes wherein the aryl groups are the same or different, dispersed within a suitable solvent system. Preferably, the pressure sensitive silicone adhesive is a polydialkylsiloxane or an alkylpolysiloxane having alkyl groups contain 1 or 2 carbon atoms. Most preferably the silicone adhesive is a dimethylpolysiloxane.

Any suitable organic solvent system may be used, provided that it results in complete coating of the adhesive onto the polyester film 14 without leaving any uncoated areas, e.g. "fish-eyes" or "beads." The solvents may be aliphatics, aromatics, or preferably mixtures thereof. Examples of suitable solvents include benzene, toluene, xylene, methyl ethyl ketone, acetone (not desired), hexane, heptane, octane, nonane, halogenated solvents like trichlorethane, ethyl acetate, and the like.

The siloxane solution deposited on the polyester film contains about 3 to 15% solids, preferably about 5 to 10% solids. Generally, a very dilute solution should be used to provide the necessary adherence to the copper foil during manufacture, storage, and use, while simultaneously avoiding any transfer to the copper foil when subjected to high temperature and high pressure.

The adhesive 18 may be deposited on the protective film 14 by any convention coating means known to the art. Most commonly, Mayer rod coating, gravure coating, or five roll coating is used. Although the specific coat weight depends upon the specific adhesive, generally the adhesive 18 is used in an amount of about 0.2 to 10, preferably about 0.3 to 5, most preferably about 0.5 to 1.0, lbs per ream dry (wherein one ream is 3,000 ft$^2$).

The multilayer film of the present invention may be prepared in any suitable manner, provided that the adhesive is directly deposited on the polyester film and the solvents removed prior to contacting the copper foil. For convenience sake it has been found desirable to first coat the smooth side of a deep matte polyester film with a commercial silicone release composition using a Mayer rod coater and to then pass the coated film immediately into an oven at a temperature of about 200 to 400° F. (depending upon the specific system and catalyst) to accomplish thermal curing. In a second pass, the adhesive solution composition is applied to the opposite (matte, roughened) side of the polyester film and the solvents removed by accelerated thermal evaporation. Suitable temperatures generally range from about 200 to 400° F.

The so-prepared polyester film is laminated onto a copper foil using only nip roll pressure of about 10 to 100 psi, preferably about 20 to 50 psi. While the laminating can be performed at room temperature, the use of elevated temperature, i.e. to about 250° F., has been found advantageous.

In the following non-limiting examples and comparative examples, all parts and percents are by weight unless otherwise specified.

EXAMPLE 1

A multilayer protected copper foil is prepared as follows: The smooth side of a 1 mil thick deep matte polyester film is first coated with a commercial silicone release composition (DCP-7200 from DCP Inc.) at a rate of 0.4 #/ream using a Mayer rod. The coated film is immediately passed to an oven at 325° F. to effect thermal cure of the release polymer. The release polymer coated film is collected.

In a second pass, a pressure sensitive silicone adhesive as a solution of 60% dimethylpolysiloxane, 30% toluene, and 10% xylene, (KR-101-10) is diluted to 5% solids by the addition of heptane.

The solution is applied to the opposite (rough) side of the polyester film at a rate of 2#/ream. The coated film is then subjected to accelerated thermal evaporation of the solvents by passing it through a drying oven set at 200–250° F. The dried adhesive adheres strongly to the polyester film. The coated film is collected.

The so-prepared polyester film is laminated onto a 1 oz. copper foil with nip roll pressure (about 40 psi) at room temperature.

The resulting laminate is wound up until cut into specific sheet sizes for actual use.

EXAMPLE 2

The protected copper foil film of Example 1 is evaluated by exposing it to conditions of heat and pressure as occur in use. A 12"×18" dual platen Dake laminating press is used. Each lamination stack contained in order, the product of Example 1, a B-stage epoxy coated glass cloth, a conventional release film, kraft paper (99#), 0.050" aluminum separator plates, and 0.090 stainless steel carriers. Two samples are laminated at the same time at each of the following three sets of laminating conditions:

(a) 365° F., 300 psi (b) 365° F., 350 psi (c) 390° F., 400 psi

The time at maximum temperature and pressure is 90 minutes.

Upon cooling, the copper foil is found to be tightly bonded to the epoxy prepreg and the polyester film is easily removed from the copper foil. No adhesive remains on the copper foil.

EXAMPLE 3

The procedures of Examples 1 and 2 are repeated except that the silicone adhesive is replaced by the following siloxane pressure sensitive adhesive systems of NuSil Technology, Carpinteria, Calif.:

(a) PSA-9839

(b) PSA-9930

(c) PSA-9931

After exposure of the laminated structures to 350° F. and 325 psi for 90 minutes, each of the samples shows no adhesive transfer to the copper foil and the polyester film is easily removed therefrom.

COMPARATIVE EXAMPLE A

The procedure of Example 1 was repeated except that the pressure sensitive silicone adhesive was replaced by each of the following aqueous emulsion adhesive systems:

(1) Air Products 1625 multipolymer (2) Air Products 1685 multipolymer.

An adhesive polymer film formed and the samples were evaluated as in Example 2. After exposure to 350° F. and 325 psi for 90 minutes, each of the samples showed extensive adhesive transfer (blocking) to the copper foil and thus were not usable.

COMPARATIVE EXAMPLE B

The procedure of Example 1 was repeated except that the pressure sensitive silicone adhesive was replaced by the following aqueous acrylic polymer adhesive system:

Ashland—Aeroset-1452-Z-40

At first a uniform coating could not be produced. Then the adhesive was diluted to 3% solids and a polymer film formed. The samples were evaluated as in Example 2. After exposure to 350° F. and 325 psi for 90 minutes, each of the samples showed extensive adhesive transfer (blocking) to the copper foil and were not usable.

COMPARATIVE EXAMPLE C

The procedure of Example 1 was repeated except that the pressure sensitive silicone adhesive was replaced by the following aqueous acrylic polymer adhesive system: DCP—DC-7009. A uniform coating was readily produced and peel adhesion seemed good. The samples were evaluated as in Example 2. After exposure to 350° F. and 325 psi for 90 minutes, each of the samples showed extensive adhesive transfer (blocking) to the copper foil and thus were not usable.

COMPARATIVE EXAMPLE D

The procedure of Example 1 was repeated except that the pressure sensitive silicone adhesive was replaced by the following aqueous acrylic polymer adhesive systems:

(1) Morton-Thiokol 240 and (2) Morton-Thiokol 245.

The samples were evaluated as in Example 2. After exposure to 350° F. and 325 psi for 90 minutes, each of the samples showed extensive adhesive transfer (blocking) to the copper foil and thus were not usable.

What is claimed is:

1. A protected copper foil laminate comprising a copper foil layer having a first side and a second side, wherein the first side is covered by a dielectric layer of an epoxy resin-impregnated woven glass fiber body and the second side is covered by a multi-layer protective film, wherein the multi-layer protective film has (i) an outer surface consisting of a silicone polymer release composition which prevents adhesion of the film to the copper at high temperature and pressure laminating conditions, and (ii) an inner surface adjacent the copper foil layer, said inner surface having disposed uniformly thereon a solution of a pressure sensitive polysilicone polymer in an organic solvent from which the organic solvent is removed, and wherein after exposure of the copper foil laminate to a temperature of at least 300° F. and a pressure of at least 300 psi, no pressure sensitive silicone polymer transfers to the copper foil layer.

2. The laminate of claim 1, wherein the protective film is a deep matte polyester film.

3. The laminate of claim 1, wherein the release coating is selected from acrylic and silicone release coatings.

4. The laminate of claim 1, wherein the release coating comprises a silicone compound in an organic solvent and a metal polymerization catalyst selected from the group consisting of tin, palladium, platinum, and rhodium.

5. The laminate of claim 1, wherein the release coating is present in an amount of about 0.2 to 5 lbs per ream dry.

6. The laminate of claim 1, wherein the pressure sensitive siloxane adhesive is a condensation reaction of a siloxane gum and a siloxane resin.

7. The laminate of claim 3, wherein the pressure sensitive silicone adhesive is a siloxane polymer.

8. The laminate of claim 7, wherein the siloxane polymer is selected from the group consisting of polyalkylsiloxanes wherein the alkyl group contains 1 to 4 carbon atoms, polydialkylsiloxanes wherein the alkyl groups are the same or different and contain 1 to 4 carbon atoms, polyaryl-substituted-dialkylsiloxanes, halosiloxanes, and polydiarylsiloxanes wherein the aryl groups are the same or different.

9. The laminate of claim 7, wherein the siloxane polymer is a polydialkylsiloxane or alkylpolysiloxane and said alkyl groups contain 1 or 2 carbon atoms.

10. The laminate of claim 7, wherein the solution of siloxane polymer contains about 3 to 15% solids and is used in an amount of about 0.2 to 10 lbs per ream dry.

11. The laminate of claim 1, wherein two conductive copper foil laminates are on the sides of the dielectric layer.

12. A copper foil laminate consisting of:
(A) a clean copper foil sheet having a first side and a second side;
(B) a dielectric layer of an epoxy resin-impregnated woven glass fiber body covering the first side of the clean copper foil sheet; and
(C) a protective deep matte polyester film laminated to the second side of the copper foil sheet, said film having a smooth side and a rough side and having a uniform release coating on the entire smooth side and a uniform pressure sensitive silicone adhesive on the entire rough side, said silicone adhesive being in adhesive contact with the copper foil sheet,
wherein no adhesive transfers to the copper foil sheet after exposure of the laminate to a temperature of at least 300° F. and a pressure of at least 300 psi.

13. The laminate of claim 12, wherein a second conductive copper foil laminate is located on the dielectric layer.

14. The laminate of claim 12, wherein the release coating is selected from acrylic and silicone release coatings.

15. The laminate of claim 12, wherein the release coating comprises a silicone compound in an organic solvent and a metal polymerization catalyst selected from the group consisting of tin, palladium, platinum, and rhodium.

16. The laminate of claim 12, wherein the release coating is present in an amount of about 0.2 to 5 lbs per ream dry.

17. The laminate of claim 12, wherein the pressure sensitive siloxane adhesive is a condensation reaction of a siloxane gum and a siloxane resin.

18. The laminate of claim 12, wherein the pressure sensitive adhesive is a siloxane polymer selected from the group consisting of polyalkylsiloxanes wherein the alkyl group contains 1 to 4 carbon atoms, polydialkylsiloxanes wherein the alkyl groups are the same or different and contain 1 to 4 carbon atoms, polyaryl-substituted-dialkylsiloxanes, halosiloxanes, and polydiarylsiloxanes wherein the aryl groups are the same or different.

19. The laminate of claim 18, wherein a solution of siloxane polymer containing about 3 to 15% solids is used in an amount of about 0.2 to 10 lbs per ream dry.

* * * * *